United States Patent
Homma

(10) Patent No.: US 8,074,186 B2
(45) Date of Patent: Dec. 6, 2011

(54) LEAKAGE CURRENT ANALYZING APPARATUS, LEAKAGE CURRENT ANALYZING METHOD, AND COMPUTER PRODUCT

(75) Inventor: Katsumi Homma, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 683 days.

(21) Appl. No.: 12/203,636

(22) Filed: Sep. 3, 2008

(65) Prior Publication Data

US 2009/0222773 A1 Sep. 3, 2009

(30) Foreign Application Priority Data

Feb. 28, 2008 (JP) ................. 2008-048106

(51) Int. Cl.
*G06F 17/50* (2006.01)
(52) U.S. Cl. ............................ 716/51; 716/112; 716/136
(58) Field of Classification Search .................... 716/51, 716/136, 112
See application file for complete search history.

(56) References Cited

U.S. PATENT DOCUMENTS 7,934,182 B2 * 4/2011 Nitta et al. .................... 716/100
2004/0254776 A1 * 12/2004 Andou ............................ 703/19

FOREIGN PATENT DOCUMENTS

JP A 2003-316849 11/2003

OTHER PUBLICATIONS

Rajeev Rao, et al., "Statistical Analysis of Subthreshold Leakage Current for VLSI Circuits." IEEE Transactions on Very Large Scale Integration (VLSI) Systems, vol. 12, No. 2, Feb. 2004, pp. 131-139.

* cited by examiner

*Primary Examiner* — Vuthe Siek
(74) *Attorney, Agent, or Firm* — Greer, Burns & Crain, Ltd.

(57) ABSTRACT

A leakage current analyzing apparatus receives input of data used for analysis and indicating intra/inter-chip variation concerning the gate length of transistors constituting cells in a circuit to be designed, where the inter-chip variation is handled as a discrete probability density distribution R. Using the data input, the leakage current analyzing apparatus obtains a cumulative probability density for a leakage current value (of the circuit) that is equal to or less than each arbitrary leakage current value $I_1$ to $I_J$. As a result, the leak rate of the circuit to be designed can be correctly obtained without limiting the shape of distribution.

6 Claims, 5 Drawing Sheets

| CELL NAME | INTRA-CHIP VARIATION | | LEAK/GATE LENGTH COEFFICIENT | |
|---|---|---|---|---|
| | AVERAGE VALUE | STANDARD DEVIATION | COEFFICIENT $q_1$ | COEFFICIENT $q_2$ |
| C1 | $m_{intra}(1)$ | $\sigma_{intra}(1)$ | $q_1(1)$ | $q_2(1)$ |
| C2 | $m_{intra}(2)$ | $\sigma_{intra}(2)$ | $q_1(2)$ | $q_2(2)$ |
| ⋮ | ⋮ | ⋮ | ⋮ | ⋮ |
| Ci | $m_{intra}(i)$ | $\sigma_{intra}(i)$ | $q_1(i)$ | $q_2(i)$ |
| ⋮ | ⋮ | ⋮ | ⋮ | ⋮ |
| Cn | $m_{intra}(n)$ | $\sigma_{intra}(n)$ | $q_1(n)$ | $q_2(n)$ |

FIG.5

| INTER-CHIP VARIATION | PDF VALUE |
|---|---|
| $L_1$ | $p(L_1)$ |
| $L_2$ | $p(L_2)$ |
| ⋮ | ⋮ |
| $L_k$ | $p(L_k)$ |
| ⋮ | ⋮ |
| $L_K$ | $p(L_K)$ |

| LEAK CURRENT | PDF VALUE |
|---|---|
| $I_1$ | $P(I_1)$ |
| $I_2$ | $P(I_2)$ |
| ⋮ | ⋮ |
| $I_j$ | $P(I_j)$ |
| ⋮ | ⋮ |
| $I_J$ | $P(I_J)$ |

| LEAK CURRENT | CDF VALUE |
|---|---|
| $I_1$ | $C(I_1)$ |
| $I_2$ | $C(I_2)$ |
| ⋮ | ⋮ |
| $I_j$ | $C(I_j)$ |
| ⋮ | ⋮ |
| $I_J$ | $C(I_J)$ |

⟵ 700

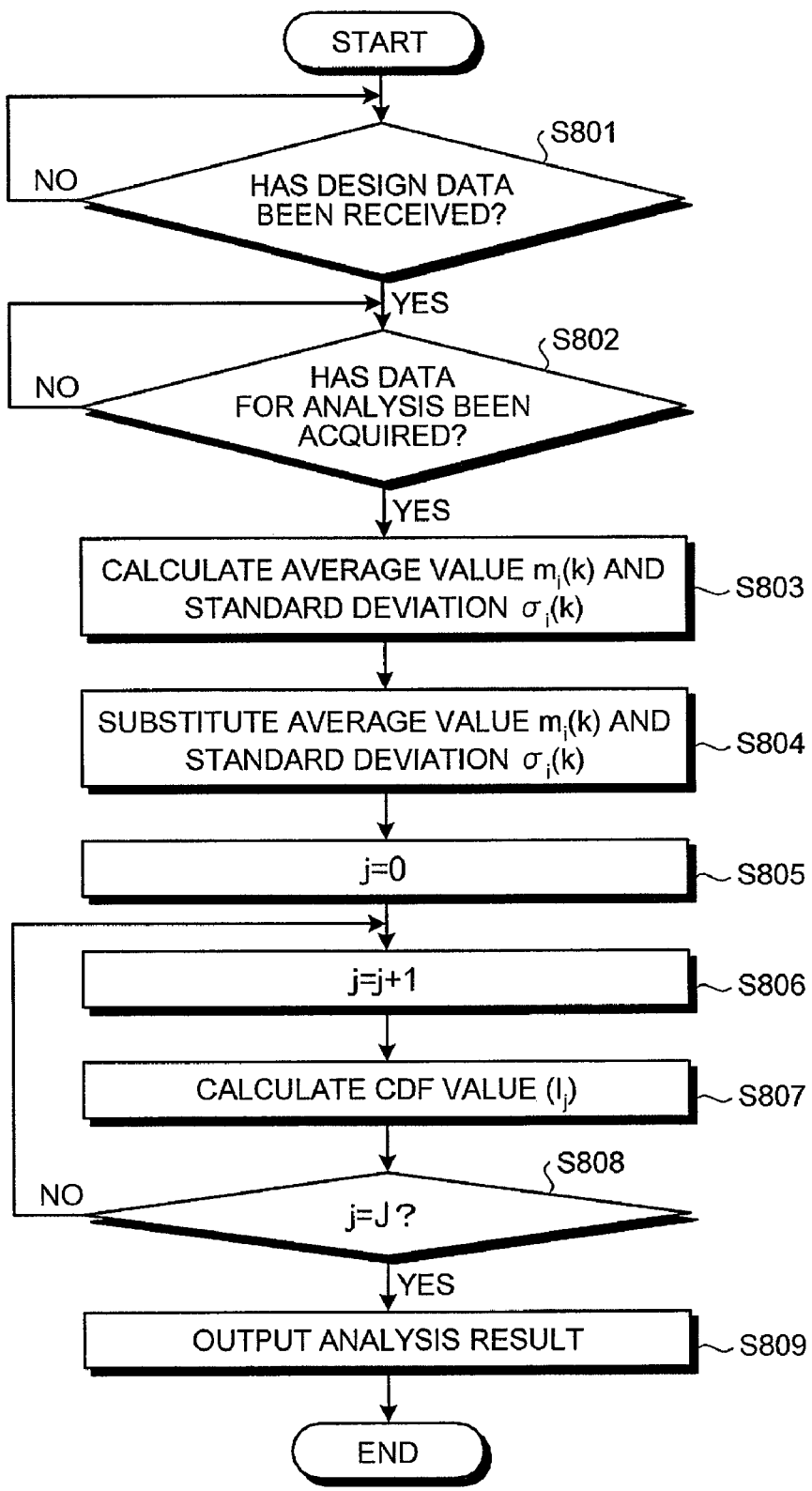

LEAKAGE CURRENT ANALYZING APPARATUS, LEAKAGE CURRENT ANALYZING METHOD, AND COMPUTER PRODUCT

CROSS-REFERENCE TO RELATED APPLICATIONS

This application is based upon and claims the benefit of priority from the prior Japanese Patent Application No. 2008-048106, filed on Feb. 28, 2008, the entire contents of which are incorporated herein by reference.

BACKGROUND OF THE INVENTION

1. Field of the Invention

The present invention relates to statistical estimation of leakage current in a semiconductor integrated circuit.

2. Description of the Related Art

Recently, with the higher integration of semiconductor integrated circuits, leakage current therein tends to increase. Leakage current is current that flows in an electronic circuit through a portion that should not have any current flow. Leakage current increases power consumption and the heat generated by the semiconductor integrated circuit, and can cause degraded circuit performance.

Therefore, it is important to correctly estimate leakage current and to take countermeasures when a circuit is designed. Meanwhile, due to reductions in chip dimension, variation of leakage current caused by the reductions has increased. Thus, conventional statistical analysis tends to pessimistically estimate the maximal current leak of a circuit. Therefore, a technique of more accurately estimating current leak is demanded.

Generally, it is known that element variation and wiring variation handled by statistical analysis has an intra-chip variation component that is independent for each element and wiring, and an inter-chip variation component that is correlated among elements/wiring. Conventionally, an approach of statistically estimating leakage current includes a Monte Carlo method of repeating for several tens of thousands of times a deterministic leakage current analysis of several million elements, and an approach of performing the multiple (numerical) integral of several million variables using the probability distribution of each element.

Other approaches include an approach of statistically estimating leakage current taking into account only the intra-chip variation component and an approach of statistically estimating leakage current by fixing a leak distribution function of the inter-chip variation component as a normal function or a logarithmic normal function such as that described in, for example, Japanese Patent Application Laid-Open Publication No. 2003-316849, and by Rajeev Rao, Ashish Srivastava, David Blaauw, Dennis Sylvester in "Statistical Analysis of Subthreshold Leakage Current for VLSI Circuits", IEEE TRANSACTIONS ON VERY LARGE SCALE INTEGRATION (VLSI) SYSTEMS, Vol. 12, No. 2, February 2004, pp. 131-139.

However, although both the Monte Carlo method and the approach of statistically estimating a leakage current by multiple integral using the probability distribution of each element can correctly estimate the leakage current, a problem arises in that the calculations involved for both the Monte Carlo method and the approach, consume an enormous amount of time and the calculation is nearly impossible.

The conventional techniques disclosed in Japanese Patent Application Laid-Open Publication No. 2003-316849 and by Rajeev Rao, et al. can not accurately handle the inter-chip variation component and therefore, a problem arises in that the accuracy of the leakage current analysis is degraded. More specifically, when the correlation among elements/wiring due to the inter-chip distribution is strong, the shape of the leak distribution is not necessarily that of a normal distribution or a logarithmic normal distribution. Therefore, the error of the maximal leakage current value (for example, about 17%) increases and, as a result, correction of the circuit design after delivery occurs. Therefore, a problem has arisen in that the work load on designers increases and the time period for designing becomes longer.

SUMMARY OF THE INVENTION

It is an object of the present invention to at least solve the above problems in the conventional technologies.

A computer-readable recording medium according to one aspect of the present invention stores therein a leakage current analyzing program that causes a computer to execute acquiring a probability density distribution that represents a first variation component specific to each cell in a circuit to be designed and concerning a gate length of a transistor constituting a cell, and a discrete probability density distribution that represents a second variation component common to all the cells of the circuit and concerning the gate length; calculating, based on the probability density distribution and the discrete probability density distribution acquired at the acquiring and a function model that expresses leakage current variation of a cell as a product of the first variation component and the second variation component, a cumulative probability density for a leakage current value of the circuit, the leakage current value of the circuit being less than or equal to an arbitrary leakage current value; and outputting, for each arbitrary leakage current value, the cumulative probability density calculated at the calculating.

A leakage current analyzing apparatus according to another aspect of the present invention includes an acquiring unit that acquires a probability density distribution that represents a first variation component specific to each cell in a circuit to be designed and concerning a gate length of a transistor constituting a cell, and a discrete probability density distribution that represents a second variation component common to all the cells of the circuit and concerning the gate length; a calculating unit that, based on the probability density distribution and the discrete probability density distribution acquired by the acquiring unit and a function model that expresses leakage current variation of a cell as a product of the first variation component and the second variation component, calculates a cumulative probability density for a leakage current value of the circuit, the leakage current value being less than or equal to an arbitrary leakage current value; and an output unit that, for each arbitrary leakage current value, outputs the cumulative probability density calculated at the calculating.

A leakage current analyzing method according to still another aspect of the present invention includes acquiring a probability density distribution that represents a first variation component specific to each cell in a circuit to be designed and concerning a gate length of a transistor constituting a cell, and a discrete probability density distribution that represents a second variation component common to all the cells of the circuit and concerning the gate length; calculating, based on the probability density distribution and the discrete probability density distribution acquired at the acquiring and a function model that expresses leakage current variation of a cell as a product of the first variation component and the second variation component, a cumulative probability density for a leakage current value of the circuit, the leakage current value of the circuit being less than or equal to an arbitrary leakage current value; and outputting, for each arbitrary leakage current value, the cumulative probability density calculated at the calculating.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 5 is a second table of an example of data for the analysis;
FIG. 6 is a table of leakage current values that are arbitrarily set;
FIG. 7 is a table of an example of an analysis result;
and
FIG. 8 is a flowchart of a leakage current analysis process of the leakage current analyzing apparatus.

DETAILED DESCRIPTION OF THE PREFERRED EMBODIMENTS

Referring to the accompanying drawings, exemplary embodiments according to the present invention are explained in detail below. According to one aspect of the embodiments, an approach of an efficient and accurate statistical leakage current analysis that takes into account the intra-chip variation and the inter-chip variation, by obtaining the leak rate of the circuit to be designed without limitation on the shape of distribution is proposed.

Figure 1:
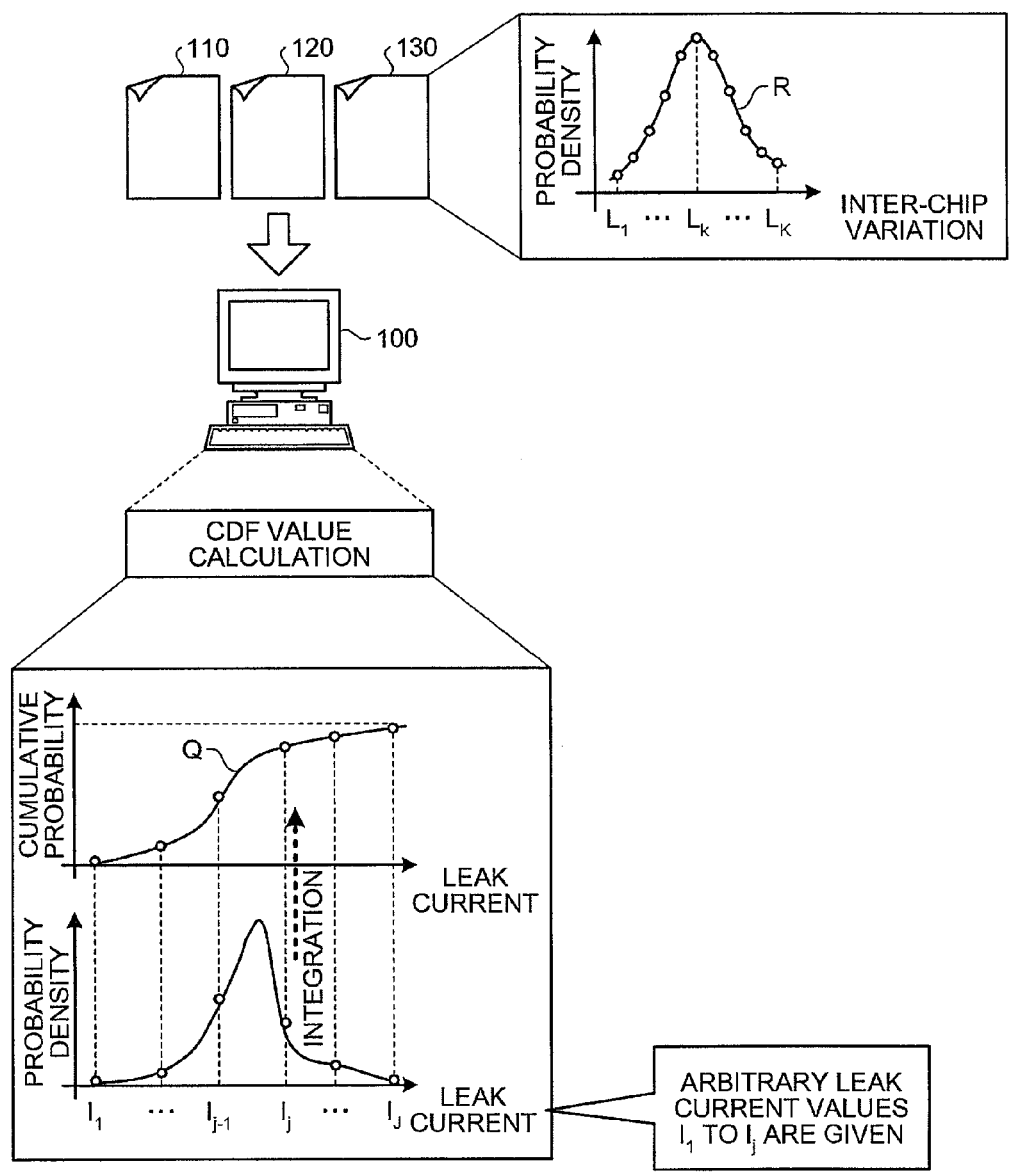
FIG. 1 is a schematic of an overview of an embodiment.

FIG. 1 is a schematic of an overview of an embodiment. In the embodiment, a cumulative probability density (CDF value), where the leakage current value of a circuit to be designed is equal to or less than an arbitrarily given leakage current value (in FIG. 1, $I_1, \ldots I_{j-1}, I_j, \ldots, I_J$), is obtained for each of the leakage current values $I_1$ to $I_J$.

As depicted in FIG. 1, a leakage current analyzing apparatus 100 is a computer apparatus that statistically analyzes leakage current of a circuit to be designed. The leakage current analysis of the circuit to be designed is performed by an input of design data 110 of the circuit to be designed and data 120 and 130, used for the analysis, into the leakage current analyzing apparatus 100.

The data 120 and 130 used for the analysis are information indicating the variation of the gate lengths of transistors constituting cells in the circuit to be designed. The data 120 used for the analysis includes information that indicates a variation component that concerns the gate lengths and is specific to each cell (intra-chip variation component). Detailed description of the data 120 used for the analysis will be given later referring to FIG. 4.

The data 120 used for the analysis further includes information that identifies the leakage current values $I_1$ to $I_J$ arbitrarily given by a designer. Detailed description of the data that identifies the leakage current values $I_1$ to $I_J$ will be given later referring to FIG. 6.

The data 130 used for the analysis includes information that indicates a variation component that concerns gate length and is common to all the cells (inter-chip variation component). In this case, the probability density for each dividing point (in this case, $L_1$ to $L_K$) dividing a probability density distribution R, indicative of the inter-chip variation, into distribution sections is used as the inter-chip variation component (discrete value). Detailed description of the data 130 used for the analysis will be given later with reference to FIG. 5.

The leakage current variation of a cell is related to the gate length variation of the transistors constituting the cell and this variation is empirically known to be expressed using equation (1) where $\Delta I$ is the leakage current variation of the cell, L is the gate length variation of the transistors, and $q_1$ and $q_2$ are leak/gate length coefficients.

$$\Delta I = q_1 \exp(q_2 L) \tag{1}$$

The gate length variation of the transistors is the sum of the intra-chip variation component and the inter-chip variation component and this variation can be expressed using equation (2) where $L_{typ}$ is the average value, $\Delta L_{intra}$ is the intra-chip variation component, and $\Delta L_{inter}$ is the inter-chip variation component.

$$L = L_{typ} + \Delta L_{intra} + \Delta L_{inter} \tag{2}$$

From the above, the leakage current variation of the cell can be expressed using equation (3) obtained by substituting equation (2) in equation (1), where A is a constant, and u( ) and v( ) are functions.

$$\Delta I = A \times u(\Delta L_{intra}) \times v(\Delta L_{inter}) \tag{3}$$

As described above, the leakage current variation $\Delta I$ of the cell can be expressed by the product of the intra-chip variation component $\Delta L_{intra}$ and the inter-chip variation component $\Delta L_{inter}$ that constitute the gate length variation of the transistors.

In the embodiment, using this relation (equation (3)), a cumulative probability density, where the leakage current value of the circuit to be designed is equal to or less than a certain leakage current value (leakage current values $I_1$ to $I_J$), is obtained. In this case, each of the leakage current values $I_1$ to $I_J$ is given without limiting the shape of distribution.

As a result, a cumulative leakage current distribution Q (leak rate) of the entire circuit, for which the intra-chip variation and the inter-chip variation of the circuit to be designed are taken into account, can be obtained accurately without limiting the shape of distribution.

Figure 2:
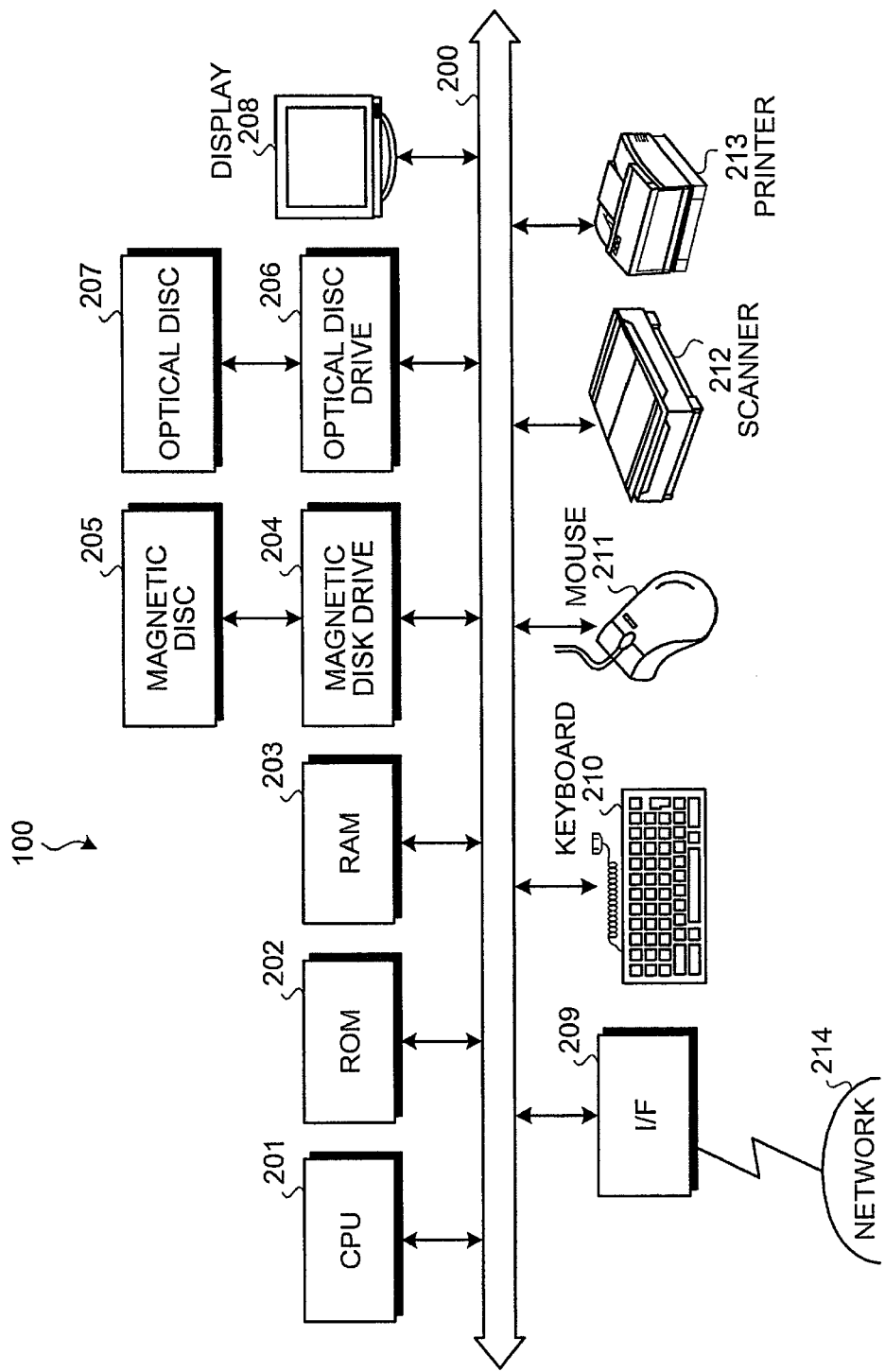
FIG. 2 is a block diagram of a leakage current analyzing apparatus according to the embodiment.

FIG. 2 is a block diagram of a leakage current analyzing apparatus according to the embodiment of the present invention. As depicted in FIG. 2, the leakage current analyzing apparatus 100 includes a central processing unit (CPU) 201, a read-only memory (ROM) 202, a random access memory (RAM) 203, a magnetic disc drive 204, a magnetic disc 205, a optical disc drive 206, a optical disc 207 as an example of a removal recording medium, a display 208, an interface (I/F) 209, a keyboard 210, a mouse 211, a scanner 212, and a printer 213. These component units are connected to one another by way of a bus 200.

The CPU 201 governs overall control of the leakage current analyzing apparatus 100. The ROM 202 stores programs such as a boot program. The RAM 203 is used as a work area of the CPU 201. The magnetic disc drive 204, under the control of the CPU 201, controls reading/writing of data from or to the magnetic disc 205. The magnetic disc 205 stores the data written under control of the magnetic disc drive 204. Further, a hard disc, flexible disc, etc. may be adopted in place of the magnetic disc 205.

The optical disc drive 206, under the control of the CPU 201, controls reading/writing of data from or to the optical disc 207. The optical disc 207 stores the data written under control of the optical disc drive 206 and has the data stored in the optical disc 207 read by the leakage current analyzing apparatus 100.

Further, in place of the optical disc 207, a compact disc (CD), a Digital Versatile Disc (DVD), a magneto optical disk (MO), or a memory card, for example, may be adopted. The display 208 displays a cursor, an icon, a tool box, and data such as document, image, and function information. The display 208 may be, for example, a cathode ray tube (CRT), a thin-film-transistor (TFT) liquid crystal display, or a plasma display.

The I/F 209 is connected to a network 214 such as Internet through a telecommunication line and is connected to other devices by way of the network 214. The I/F 209 serves as an interface between the network 214 and the inside of the apparatus and controls the input and output of data from or to external devices. The I/F 209 may be, for example, a modem or a local area network (LAN) adapter.

The keyboard 210 is equipped with keys for the input of characters, numerals, and various instructions, and data is entered through the keyboard 210. The keyboard 210 may be a touch-panel input pad or a ten-key keypad. The mouse 211 performs cursor movement, range selection, and movement, size change, etc., of a window. The mouse 211 may be a trackball or a joystick if it has similar functions as a pointing device.

The scanner 212 optically reads an image and takes in the image data into the leakage current analyzing apparatus 100. The scanner 212 may have an optical character recognition (OCR) function as well. The printer 213 prints image data and document data. The printer 213 may be, for example, a laser printer or an ink jet printer.

Figures 3, 4:
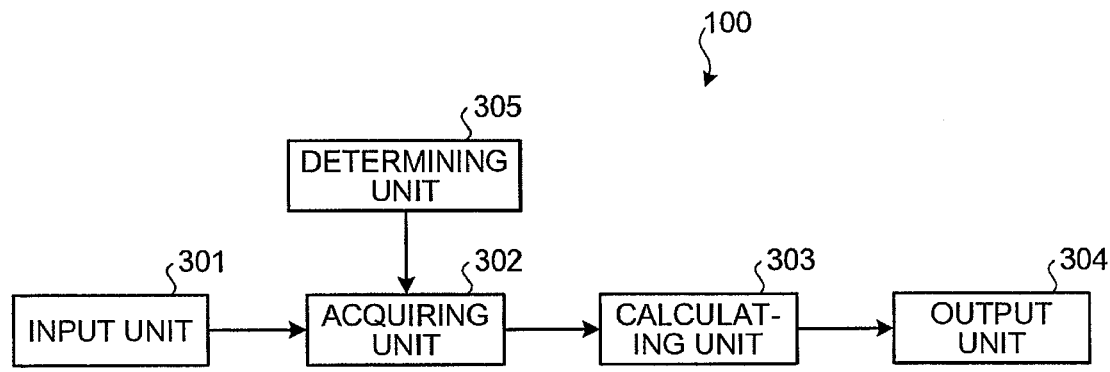
FIG. 3 is a functional diagram of the leakage current analyzing apparatus.
FIG. 4 is a table of an example of data for an analysis.

FIG. 3 is a block diagram of a functional configuration of the leakage current analyzing apparatus. As depicted in FIG. 3, the leakage current analyzing apparatus 100 includes an input unit 301, an acquiring unit 302, a calculating unit 303, an output unit 304, and a determining unit 305.

Respective functions of the input unit 301, the acquiring unit 302, the calculating unit 303, the output unit 304, and the determining unit 305 can be realized by causing a CPU to execute a corresponding program stored in a storing unit of the leakage current analyzing apparatus 100, or by using an input/output interface. Data output from each of the units (301 to 305) is stored in the storing unit. The function of each connection destination, indicated by each of the arrows in FIG. 3, is realized by reading from the storing unit, the data output from a connection origin and causing the CPU to execute the program corresponding to the function.

The input unit 301 has a function of receiving an input of design data concerning the circuit to be designed. The design data may be a netlist of the circuit to be designed after logical synthesis. Information indicative of cell arrangement and connection relationships among the cells in the circuit to be designed are described in the netlist. A cell may be an inverter, a flip-flop, a buffer, wiring, etc.

The acquiring unit 302 has a function of acquiring the probability density distribution that represents a cell-specific variation component (intra-chip variation component) concerning the gate lengths of the transistors constituting each cell in the circuit to be designed, and the discretized probability density distribution that represents the variation component common to all the cells (inter-chip variation component) and concerning the gate lengths.

These probability density distributions may be directly input into the leakage current analyzing apparatus 100 as the data 120 and 130 depicted in FIG. 1, or the distributions may be acquired from an external source not depicted, or extracted from a database or a library not depicted. For example, a cell is identified using, as a clue, the name of the cell described in the design data received by the input unit 301 and the corresponding information is extracted from a library of a commercially available design tool.

FIG. 4 is a table of an example of the data for the analysis. As depicted in FIG. 4, the data 120 used for the analysis includes, for each cell C1 to Cn in the circuit to be designed, the average value $M_{intra}$ of the probability density distribution representing the intra-chip variation component that is specific to each of the cells C1 to Cn, the standard deviation $\sigma_{intra}$, and the leak/gate length coefficients $q_1$ and $q_2$.

The leak/gate length coefficients $q_1$ and $q_2$ are coefficients used when the leakage current variation of a cell expressed in equation (1) is represented using the gate length variation of the transistors. In this case, taking a cell $C_i$ as an example, the average value of the probability density distribution that represents the intra-chip variation component is $m_{intra}(i)$, the standard deviation is $\sigma_{intra}(i)$, and leak/gate length coefficients are $q_1(i)$ and $q_2(i)$.

FIG. 5 is a second table of an example of the data for the analysis. As depicted in FIG. 5, the data 130 used for the analysis includes a probability density distribution value (PDF value) for each of the dividing points $L_1$ to $L_K$ dividing, into distribution sections, a probability density distribution R indicative of the inter-chip variation. The inter-chip variation component is the common distribution in the circuit to be designed and, therefore, the PDF value of each of the dividing points $L_1$ to $L_K$ is a value that is common to all the cells.

Description with reference to FIG. 3 is continued herein. The calculating unit 303 has a function of calculating the cumulative probability density for a leakage current value (of the circuit to be designed) that is equal to or less than a leakage current value arbitrarily given, based on the probability density distribution acquired by the acquiring unit 302 and a function model that represents the leakage current variation of a cell as the product of the variation component specific to each cell and the variation component common to all the cells.

More specifically, for example, the calculating unit 303 calculates the cumulative probability density, where a leakage current value of the circuit to be designed is equal to or less than the leakage current value arbitrarily given, based on the data 120 and 130 depicted in FIGS. 4 and 5, and equation (3). The "leakage current value arbitrarily given" is, for example, a leakage current value that is arbitrarily set by a designer according to the function and the size of the circuit to be designed.

FIG. 6 is a table of leakage current values that are arbitrarily set. As depicted in FIG. 6, a table 600 stores the leakage current values (PDF values) respectively for the leakage currents $I_1$ to $I_J$. By graphically plotting the leakage current values $P(I_1)$ to $P(I_J)$ respectively of the leakage currents $I_1$ to $I_J$, the probability density distribution representing the leakage current of the circuit to be designed is formed.

As described above, in the embodiment, the leakage current value, which is a reference for obtaining the leak rate (the cumulative probability density that is equal to or less than this leakage current value is obtained), is given as a discrete distribution value without limiting the shape of distribution. The table 600 may be directly input into the leakage current analyzing apparatus 100 or may be included in the data 120 and 130 used for the analysis.

The calculating unit 303 calculates, for each of the leakage currents $I_1$ to $I_J$, a cumulative probability density $CDF(I_j)$ value where the leakage current value of the circuit to be designed is equal to or less than the leakage currents $I_1$ to $I_J$, based on the data 120 and 130 used for the analysis and equation (3). More specifically, the cumulative probability density CDF($I_j$) value that is equal to or less than the leakage current $I_j$ can be obtained using equation (4).

$$CDF(I_j) = \sum_{k=1}^{K} p(L_k) \times \Delta L \times Norm(I_j : m_i(k), \sigma_i(k)) \quad (4)$$

Where, $m_i(k)$ in equation (4) can be obtained using equation (5) and $\sigma_i(k)$ can be obtained using equation (6).

$$m_i(k) = \sum_{i=1}^{n} m_{intra}(i) \times q_1(i) \times \exp[q_2(i)L_k] \quad (5)$$

$$\sigma_i(k) = \sqrt{\left\{\sum_{i=1}^{n} \sigma_{intra}(i)^2 \times \exp[2q_2(i)L_k]\right\}} \quad (6)$$

Equation (4) is a function model obtained based on the leakage current value of the entire circuit to be designed being the sum of the leakage current values respectively of the cells in the circuit to be designed. More specifically, the leakage current variation of the circuit to be designed is the sum of the leakage current variation of each cell.

It is assumed that the leakage current variation of a cell Ci in the circuit to be designed is $X_i = h_i(b_i + b)$ where $b_i$ is the intra-chip variation component of the leakage current variation and b is the inter-chip variation component of the leakage current variation.

When the fact that the leakage current variation of the circuit to be designed is the sum of the leakage current variation of the cells C1 to Cn is expressed using a mathematical theorem, equation (7) is obtained, where $p_1(b_1), \ldots, p_n(b_n)$ are PDF values of the probability density distributions each respectively representing the intra-chip variation concerning gate length specific to each cell and p(b) is the PDF value of the probability density distribution representing the inter-chip variation concerning gate length common to all the cells.

$$CDF(I_j) = \int_{\{h_1(b_1+b)+\ldots+h_n(b_n+b)\} \leq I_j} p_1(b_1) \ldots p_n(b_n) p(b) \quad (7)$$

More specifically, equation (7) is obtained using the fact that the leakage current variation of a cell expressed in equation (3) is expressed by the product of the intra-chip variation component and the inter-chip variation component of the gate lengths of the transistors. This is an equation for obtaining the cumulative probability density (CDF ($I_j$)) where the leakage current value of the circuit to be designed is equal to or less than a certain leakage current value I.

When the probability density distribution R (see FIG. 1) that is common to all the cells and represents the inter-chip variation concerning gate length is handled being discretized, equation (7) is transformed into equation (8), where $\Delta L$ is the distance between consecutive dividing points of the divided sections of the probability density distribution R that represents the inter-chip variation.

$$CDF(I_j) = \sum_{k=1}^{K} p(L_k) \Delta L \int_{(h_1(b_1+L_k)+\ldots+h_n(b_n+L_k)) \leq I_j} p_1(p_1) \ldots p_n(b_n) \quad (8)$$

When the leakage current variation $h_i(b_i+b)$ of each of the cells C1 to Cn in equation (8) is variable-changed using equation (3), the cumulative probability density CDF($I_j$) value for the leakage current value (of the circuit to be designed) that is equal to or less than the leakage current $I_j$ can be expressed using equation (9) where $r_1, \ldots, r_n$ are the PDF values respectively representing the intra-chip variation of the leakage current of each of the cells C1 to Cn.

$$CDF(I_j) = \sum_{k=1}^{K} p(L_k) \Delta L \int_{(x_1+\ldots+x_N) \leq I_j} (1/v_1(L_k)) \quad (9)$$

$$r_1(x_1/v_1(L_k))\ldots(1/v_N(L_k))r_N(x_N/v_N(L_k))$$

Because the term in the integration in equation (9) is the CDF value of the sum (n variables) of independent variables, the term can be approximated by a cumulative normal distribution using the central limit theorem when n is a large number. Thereby, multiple integration of the dimensions of the total number of the cells can be calculated at the order (n) and, therefore, higher efficiency of the calculation process can be facilitated. More specifically, the term in the integration can be calculated using the average value $m_i(k)$ of the leakage current variation of each cell and the standard deviation $\sigma_i(k)$. As a result, the equation expressed by equation (4) can be obtained.

Using equation (4) obtained as described above, the cumulative leakage current variation of the cells is approximated using the cumulative normal distribution and, thereby, the cumulative probability density CDF($I_j$) that is equal to or less than the leakage currents $I_1$ to $I_J$ can be calculated for each of the leakage currents $I_1$ to $I_J$.

In equation (8), the distance $\Delta L$ between consecutive dividing points that divide the divided sections of the probability density distribution R that represents the inter-chip variation is constant (that is, descretization is uniform). However, the distance is not limited hereto. For example, $\Delta L$ may be $\Delta L = 0.5 \times (L_{k+1} - L_{k-1})$ or $\Delta L$ may be $\Delta L = L_{k+1} - L_k$ or $\Delta L = L_k - L_{k-1}$.

More specifically, all these $\Delta L$s may be employed as the distance $\Delta L$ between the dividing points and leakage current analysis of the circuit to be designed may be executed for each $\Delta L$. Further, any one $\Delta L$ may be employed and the leakage current analysis of the circuit to be designed may be executed.

The output unit 304 has a function of outputting the cumulative probability density calculated by the calculating unit 303 for each arbitrarily given leakage current value. In the example above, the outputting unit 304 outputs the cumulative probability density values CDF($I_1$) to CDF($I_J$) calculated by the calculating unit 303, respectively for the leakage currents $I_1$ to $I_J$.

The output format by the outputting unit 304 may be any one of screen display on the display 203 depicted in FIG. 2, output by printing by the printer 213, output as data to a memory (storage), and transmission to an external computer apparatus. Description will be given for a specific example of the analysis result of the leakage current analysis output by the outputting unit 304.

FIG. 7 is a table of an example of an analysis result. As depicted in FIG. 7, an analysis result 700 indicates the CDF value $C(I_1)$ to $C(I_J)$ where the leakage current of the circuit to be designed is equal to or less than the leakage currents $I_1$ to $I_J$, for each of the arbitrarily given leakage currents $I_1$ to $I_J$.

As described above, the leak rate (CDF values $C(I_1)$ to $C(I_J)$), where the leakage current value of the circuit to be designed is equal to or less than each of the arbitrarily given leakage currents $I_1$ to $I_J$, can be obtained without limiting the shape of distribution.

Description with reference to FIG. 3 is continued herein. The determining unit 305 has a function of determining the dividing points that divide, into distribution sections, the probability density distribution that represents the variation component common to all the cells. Taking an example of the probability density distribution R that represents the inter-chip variation depicted in FIG. 1, the determining unit 305 determines the dividing points $L_1$ to $L_K$ that indicate the distribution section of the probability density distribution R.

In this case, the acquiring unit 302 acquires the data 130 that reflects the determination result by the determining unit 305. More specifically, for example, the data 130 is created using the probability density distribution R representing the inter-chip variation input by the input unit 301 and the determination result by the determining unit 305, and the acquiring unit 302 acquires the data 130 used for the analysis.

A specific approach of the determination by the determining unit 305 may be, for example, that dividing points arbitrarily set by a designer may be determined as the dividing points $L_1$ to $L_K$. Further, the dividing points $L_1$ to $L_K$ that indicate the distribution section of the probability density distribution R may be determined based on the slope of the probability density distribution R.

More specifically, the dividing points are determined such that the intervals of consecutive dividing points in a distribution section having a larger inclination (slope) of the probability density distribution R are smaller. Thereby, the dividing points in a distribution section having more drastic variation of the distribution values become denser and more PDF values can be acquired as the inter-chip variation component. As a result, higher precision of the leakage current analysis can be facilitated.

The dividing points are further determined such that the intervals of consecutive dividing points in a distribution section having a smaller inclination (slope) of the probability density distribution R are larger. Thereby, the dividing points in the distribution section having more moderate variation of the distribution values become sparser and the PDF values to be acquired as the inter-chip variation component can be reduced.

As a result, reduction of the analysis period can be facilitated. For a distribution section having moderate variation of the distribution values, the need for acquiring many PDF values is low because the effect of the section on analysis accuracy is weak even when the intervals of the dividing points are set to be large.

FIG. 8 is a flowchart of a leakage current analysis process of the leakage current analyzing apparatus according to the embodiment.

As depicted in the flowchart of FIG. 8, the input unit 301 determines whether the design data of the circuit to be designed has been received (step S801). Input of the design data is waited for (step S801: NO) and, when the design data has been input (step S801: YES), the acquiring unit 302 determines whether the data 120 (including the table 600) and 130 for the leakage current analysis has been acquired (step S802).

Acquisition of the data 120 and 130 used for the analysis is waited for (step S802: NO) and, when the acquiring unit 302 acquires the data 120 and 130 (step S802: YES), the calculating unit 303 substitutes the data content of the data 120 into equations (5) and (6) to calculate the average value $m_i(k)$ and the standard deviation $\sigma_i(k)$ (step S803).

Thereafter, the calculating unit 303 substitutes the average value $m_i(k)$ and the standard deviation $\sigma_i(k)$ that are calculated into equation (4) (step S804). A variable j in equation (4) is initialized to 0 (step S805). The calculating unit 303 increments the variable j (step S806) and the calculating unit 303 calculates a CDF value $(I_j)$ (step S807).

The calculating unit 303 judges whether j=J (step S808) and, when the calculating unit 303 judges that j≠J (step S808: NO), flow returns to step S806 and the series of processes are repeated. On the other hand, when the calculating unit 303 judges that j=J (step S808: YES), the output unit 304 outputs the analysis result 700 ($\{I_j, \text{CDF}(I_j)\}_{j=1,\ldots,J}$) (step S809) and the series of processes according to the flowchart come to an end.

As described above, the leak rate of the entire circuit, taking into account the intra-chip variation and the inter-chip variation, can be correctly obtained without limiting the shape of distribution by discretizing the leakage current of the circuit to be designed and handling the discretized current. More specifically, even when the correlation among the cells due to the inter-chip distribution is strong, the shape of the leak distribution is not limited to that of a normal distribution or a logarithmic normal distribution, and the error of the maximal leakage current value can be reduced from the conventional 17% to approximately 5 to 6%.

The calculation of the leak rate is executed using the function model that expresses the leakage current variation of each cell by the product of the intra-chip variation and the inter-chip variation concerning the gate length and, thereby, higher efficiency of the calculating process can be facilitated. More specifically, the multiple integration of the dimensions of the total number of the cells (n) in the circuit to be designed in the rate calculation can be calculated at the order (n). Therefore, significant reduction of the calculation period can be realized.

As described above, according to an aspect of the embodiment, leakage current analysis can be facilitated having greater accuracy and higher speed by efficiently and correctly obtaining the leak rate without limiting the shape of distribution. Thereby, the work load of the leakage current analysis on the designer and the design period of the circuit to be designed can be reduced.

The leakage current analyzing method explained in the present embodiment can be implemented by a computer, such as a personal computer and a workstation, executing a program that is prepared in advance. The program is recorded on a computer-readable recording medium such as a hard disk, a flexible disk, a CD-ROM, an MO, and a DVD, and is executed by being read out from the recording medium by a computer. The program can be a transmission medium that can be distributed through a network such as the Internet.

The leakage current analyzing apparatus 100 described in the present embodiment can be realized by an application specific integrated circuit (ASIC) such as a standard cell or a structured ASIC, or a programmable logic device (PLD) such as a field-programmable gate array (FPGA). Specifically, for example, the functions of the units (301 to 305) of the leakage current analyzing apparatus 100 are defined in hardware description language (HDL), which is logically synthesized and applied to the ASIC, the PLD, etc., and thereby enabling manufacture of the leakage current analyzing apparatus 100.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A non-transitory computer-readable recording medium storing therein a leakage current analyzing program that causes a computer to execute:

acquiring a probability density distribution that represents a first variation component specific to each cell in a circuit to be designed and concerning a gate length of a transistor constituting a cell, and a discrete probability density distribution that represents a second variation component common to all the cells of the circuit and concerning the gate length;

calculating, based on the probability density distribution and the discrete probability density distribution acquired at the acquiring and a function model that expresses leakage current variation of a cell as a product of the first variation component and the second variation component, a cumulative probability density for a leakage current value of the circuit, the leakage current value of the circuit being less than or equal to an arbitrary leakage current value; and outputting, for each arbitrary leakage current value, the cumulative probability density calculated at the calculating.

2. The non-transitory computer-readable recording medium according to claim 1, wherein the calculating includes calculating a cumulative probability density that is equal to or less than the arbitrary leakage current value, by approximating cumulative leakage current variation of the cells using a cumulative normal distribution.

3. The non-transitory computer-readable recording medium according to claim 1, wherein the leakage current analyzing further causes the computer to execute: determining dividing points that divide, into distribution sections, the discrete probability density distribution that represents the second variation component, wherein the acquiring includes acquiring the probability density distribution that represents the first variation component and for each of the dividing points determined at the determining, probability density of the discrete probability density distribution that represents the second variation component.

4. The non-transitory computer-readable recording medium according to claim 3, wherein the determining includes determining the dividing points based on a slope of the discrete probability density distribution that represents the second variation component.

5. A leakage current analyzing apparatus comprising:

an acquiring unit that acquires a probability density distribution that represents a first variation component specific to each cell in a circuit to be designed and concerning a gate length of a transistor constituting a cell, and a discrete probability density distribution that represents a second variation component common to all the cells of the circuit and concerning the gate length;

a calculating unit that, based on the probability density distribution and the discrete probability density distribution acquired by the acquiring unit and a function model that expresses leakage current variation of a cell as a product of the first variation component and the second variation component, calculates a cumulative probability density for a leakage current value of the circuit, the leakage current value being less than or equal to an arbitrary leakage current value; and an output unit that, for each arbitrary leakage current value, outputs the cumulative probability density calculated at the calculating.

6. A leakage current analyzing method comprising:

executing by a computer operations of:

acquiring a probability density distribution that represents a first variation component specific to each cell in a circuit to be designed and concerning a gate length of a transistor constituting a cell, and a discrete probability density distribution that represents a second variation component common to all the cells of the circuit and concerning the gate length;

calculating, based on the probability density distribution and the discrete probability density distribution acquired at the acquiring and a function model that expresses leakage current variation of a cell as a product of the first variation component and the second variation component, a cumulative probability density for a leakage current value of the circuit, the leakage current value of the circuit being less than or equal to an arbitrary leakage current value; and outputting, for each arbitrary leakage current value, the cumulative probability density calculated at the calculating.

* * * * *